United States Patent
Familia et al.

(10) Patent No.: US 9,209,820 B2
(45) Date of Patent: Dec. 8, 2015

(54) APPARATUS FOR SYMMETRIC AND LINEAR TIME-TO-DIGITAL CONVERTER (TDC)

(71) Applicants: Noam Familia, Modiin (IL); Jakob Vovnoboy, Haifa (IL)

(72) Inventors: Noam Familia, Modiin (IL); Jakob Vovnoboy, Haifa (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/141,372

(22) Filed: Dec. 26, 2013

(65) Prior Publication Data

US 2015/0188553 A1    Jul. 2, 2015

(51) Int. Cl.
*H03D 13/00* (2006.01)
*H03L 7/097* (2006.01)
*H03K 5/26* (2006.01)

(52) U.S. Cl.
CPC . *H03L 7/097* (2013.01); *H03K 5/26* (2013.01)

(58) Field of Classification Search
USPC ........................................ 327/5, 159; 341/166
See application file for complete search history.

(56) References Cited

U.S. PATENT DOCUMENTS

| | | | |
|---|---|---|---|
| 7,932,847 B1* | 4/2011 | Hsieh et al. | 341/155 |
| 8,081,013 B1* | 12/2011 | Zhang et al. | 327/3 |
| 8,305,248 B2* | 11/2012 | Lee et al. | 341/166 |
| 8,415,983 B2* | 4/2013 | Tokairin | 327/12 |
| 8,570,082 B1* | 10/2013 | Kuo et al. | 327/158 |
| 2010/0134335 A1* | 6/2010 | Park et al. | 341/118 |
| 2010/0283653 A1* | 11/2010 | Dai et al. | 341/166 |
| 2011/0084863 A1* | 4/2011 | Chiu et al. | 341/141 |
| 2011/0304357 A1* | 12/2011 | Tokairin | 327/12 |
| 2012/0025846 A1* | 2/2012 | Minas et al. | 324/606 |
| 2012/0056769 A1* | 3/2012 | Wang et al. | 341/166 |
| 2012/0161831 A1* | 6/2012 | Ravi et al. | 327/156 |
| 2012/0229185 A1* | 9/2012 | Rieubon | 327/159 |
| 2013/0176158 A1* | 7/2013 | Kim et al. | 341/166 |
| 2013/0278917 A1* | 10/2013 | Korekado et al. | 356/5.01 |

* cited by examiner

*Primary Examiner* — Ryan C. Jager
(74) *Attorney, Agent, or Firm* — Blakely, Sokoloff, Taylor & Zafman LLP

(57) ABSTRACT

Described is a linear and symmetric time-to-digital converter (TDC) which comprises: a first input; a second input; a first delay line having a plurality of delay stages coupled together in series, the first delay line to receive the first input; a second delay line having a plurality of delay stages coupled together in series, the second delay line to receive the second input; and a plurality of comparators, each having first and second outputs coupled to the first and second delay lines.

20 Claims, 8 Drawing Sheets

APPARATUS FOR SYMMETRIC AND LINEAR TIME-TO-DIGITAL CONVERTER (TDC)

BACKGROUND

A time-to-digital converter (TDC) translates a time difference between two input timing signals into a digital output bus. Depending on architecture, a TDC may function as a phase detector, a frequency detector, or both. A TDC monitors two digital timing signals and decides which timing signal arrived first. A TDC optionally monitors two timing signals to determine and digitally encode the time difference between the timing signals. A TDC also produces an output signal or bus of signals that encodes the time difference of which timing signal arrived first.

Symmetrical TDCs can be used for phase locked loops (PLLs) that demand zero static phase offset and low supply noise jitter. Linear TDCs are used for PLLs that demand low jitter performance. Known TDCs are not symmetric or linear at the same time resulting in jitter on the output clock provided by the PLLs.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
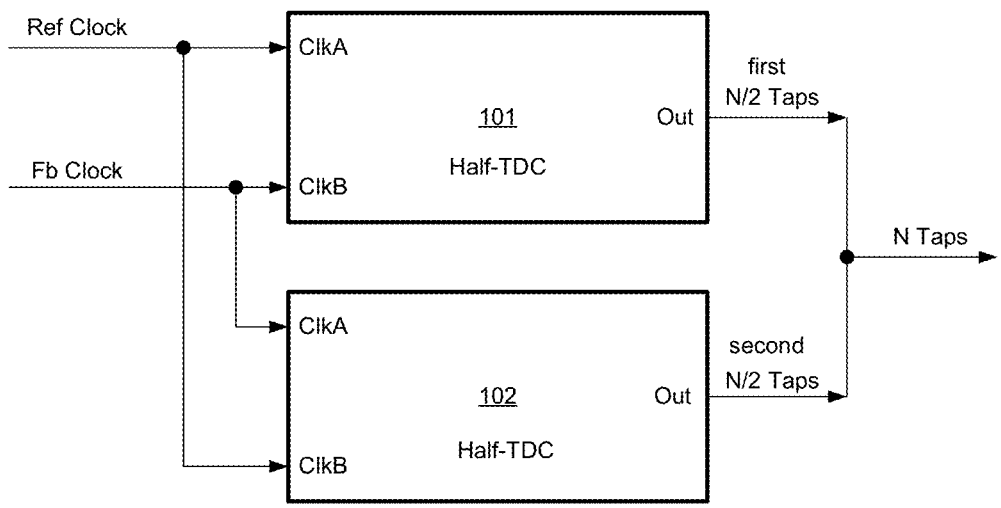
FIG. 1 illustrates a non-linear time-to-digital converter (TDC) that provides symmetry.

FIG. 1 illustrates a non-linear time-to-digital converter (TDC) 100 that provides symmetry using two half TDCs—101 and 102—with cross-coupled inputs. TDCs may be used in phase locked loops (PLLs) to determine phase difference between a Reference Clock (Ref Clock) and a Feedback Clock (Fb Clock). In this example, Half-TDC 101 receives Ref Clock and Fb Clock at its inputs ClkA and ClkB, respectively. Half-TDC 102 receives Ref Clock and Fb Clock at its inputs ClkB and ClkA, respectively i.e., the inputs for Half-TDC 102 are swapped compared to the inputs received by Half-TDC 101. The outputs "Out" of each Half TDC are N/2 taps, where 'N' is an integer, and combine to form the final N-tap output. For example, Half-TDC 101 generates the first N/2 taps that correspond to positive phase error between Ref Clock and Fb Clock while Half-TDC 102 generates the second N/2 taps that correspond to negative phase error between Ref Clock and Fb Clock. The first and second N/2 taps combine to form N Taps as output.

One problem with TDC 100 is that it suffers from non-linearity at the center of the TDC code. The center of the TDC code is generally the sensitive part of the code in that it determines the zero phase error point. A PLL locks when the phase error between Ref Clock and Fb Clock is zero. One reason for this non-linearity is an inherent difference in the first stage of each of the half TDC circuits compared to the following stages in that half TDC.

Figure 2:
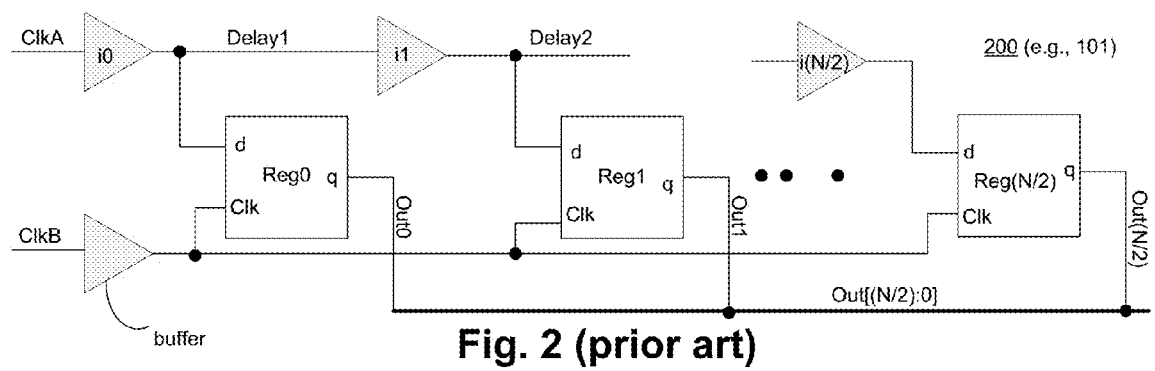
FIG. 2 illustrates a circuit implementation of a half-TDC used in FIG. 1.

FIG. 2 illustrates a circuit implementation of a Half TDC 200 (e.g., Half-TDC 101 and/or Half-TDC 102) used in TDC of FIG. 1. It is pointed out that those elements of FIG. 2 having the same reference numbers (or names) as the elements of any other figure can operate or function in any manner similar to that described, but are not limited to such.

In this example, Half TDC 200 includes N/2 flip-flops—Reg0 to Reg(N/2), where 'N' is an integer. The output Out[(N/2):0] is one of first or second N/2 taps in FIG. 1. Referring back to FIG. 2, ClkB drives all clock inputs of the flip-flops while ClkA propagates in the delay line having delay stages i0, i1, to iN, where output of each delay stage is labeled as Delay1, Delay2, etc. To allow driving all flip-flops at once, a large buffer is added to ClkB path. This buffer causes severe non-linearity between the two halves of TDC 100 because the buffer pushes the phase error between Ref Clock and Fb Clock in opposite directions at each Half-TDC 101/102. Because of this buffer, resolution of TDC 100 at the center of its code is much different than at the rest of the TDC code range.

The above deficiency is not fixed by changing the Half-TDC 200 to a vernier type delay line based half TDC (not shown). For example, in vernier type delay line where both ClkA and ClkB signals propagate in delay lines such that one delay line is faster than the other, and buffer is removed, slopes of Ref Clock and Fb Clock entering the half TDC are different than slopes of the phases within the delay line. This difference in slopes of the phases causes the delay of the first delay stage in the delay line to be different than the rest of the delays resulting in non-linearity.

Figure 3:
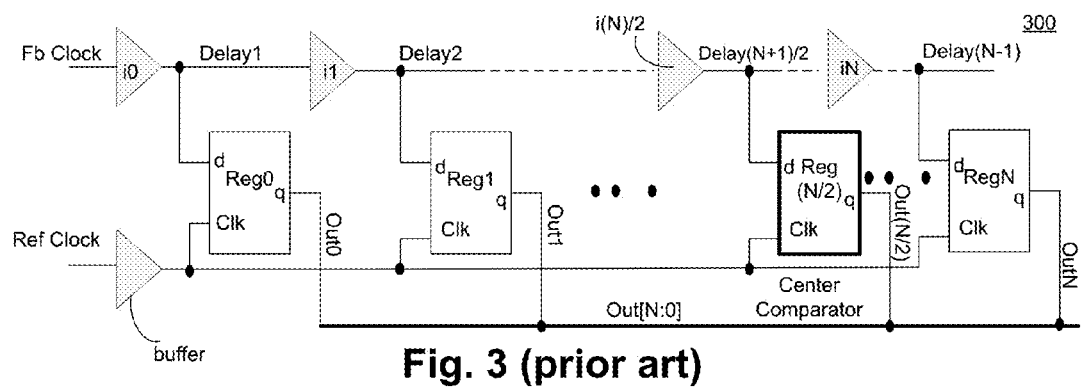
FIG. 3 illustrates another known TDC.

FIG. 3 illustrates another known TDC 300. In this example, TDC 300 provides better linearity (compared to TDC 100) at the center of the delay line, which represents zero code, but exhibits poor symmetry. TDC 300 consists of a delay line having delay stages i0, i1, i(N)/2 to iN, where 'N' is an integer. The delay line is coupled to a plurality of flip-flops Reg0-RegN as shown, where 'N' is an integer. Output of each delay stage is labeled as Delay1, Delay2, and so on. Here, Reg(N/2) is the center or middle comparator. Output of this center or middle comparator Reg(N/2) indicates zero code on the TDC output and hence the PLL may lock such that the phase error between clocks at the input of this flip-flop is zero. TDC 300 lacks symmetry because the delay from Ref Clock to the center comparator Reg(N/2) is different from the Fb Clock delay to the center comparator. If the static phase offset is zero at the center comparator Reg(N/2) then it means that the actual phase offset between Ref Clock and Fb Clock is non-zero and equals to the delay of half the delay line.

The embodiments describe a symmetric and linear TDC comprising two delay lines which are configured such that data flows in opposite directions in the delay lines with respect to each other. In one embodiment, a PLL reference clock (Ref Clock) is injected to one delay line and the feedback clock (Fb Clock) to the other delay line. In one embodiment, phase comparators (e.g., Flip-Flops, phase detectors, etc.) compare the phases between the two delay lines. In one embodiment, the path of the two clocks (i.e., the Ref Clock and the Fb Clock) to the center of the TDC range is identical and symmetric. Since the PLL is designed to lock around the center of the TDC range, the static phase offset between Ref Clock and Fb Clock is zero and the TDC is highly linear.

Continuing with the example of the PLL, in one embodiment, phase comparators are used to compare phases between the two delay lines. In one embodiment, the phase comparators are coupled to the delay lines such that the phase difference between every two consecutive comparators increments by one delay of a delay stage (in the delay line). In one embodiment, the path of the two clocks (i.e., Ref Clock and Fb Clock) to the center (or middle) of the TDC is identical and symmetric. Since the PLL locks around the center of the TDC range, the static phase offset between Ref Clock and Fb Clock is zero at the center comparator, according to one embodiment. The matched delay lines of the embodiment results in a linear behavior of the TDC.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFET transistors, Gate All Around Cylindrical Transistors or other devices implementing transistor functionality like carbon nanotubes or spintronic devices. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

Figure 4A:
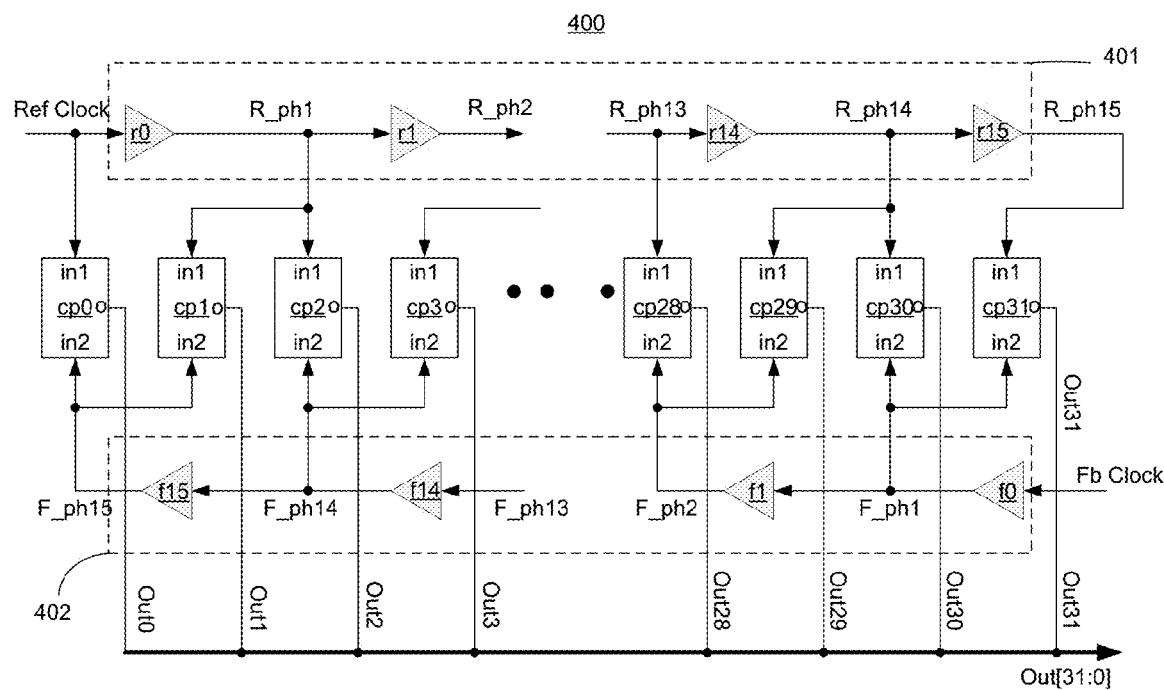
FIG. 4A illustrates a symmetric and linear TDC, according to one embodiment of the disclosure.

FIG. 4A illustrates a symmetric and linear TDC 400, according to one embodiment of the disclosure. It is pointed out that those elements of FIG. 4A having the same reference numbers (or names) as the elements of any other figure can operate or function in any manner similar to that described, but are not limited to such.

In one embodiment, TDC 400 comprises a first delay line 401, second delay line 402, and a plurality of comparators cp0-cpN, where 'N' is an integer. In this example, 'N' is 31. In one embodiment, first delay line 401 includes a plurality of delay stages r0-rM, where 'M' is an integer. In one embodiment, second delay line 402 includes a plurality of delay stages f0-fM. In this example, 'M' is 15. In one embodiment, each comparator of the plurality of comparators cp0-cpN has two inputs "in1" and "in2" and an output 'o.' The output 'o' from each comparator concatenates with other outputs to form output Out[31:0] of TDC 400.

In one embodiment, TDC 400 receives Fb Clock and Ref Clock as inputs, and it generates a digital binary-encoded output word Out[31:0] that represents the time difference between the two clocks. In one embodiment, resolution of TDC 400 is defined by an amount of time difference that guarantees a change in the output value of '1', or a single LSB (least significant bit). In one embodiment, the resolution of TDC 400 is fine enough to avoid injecting significant quantization noise into the PLL but not so fine as to incur significant power consumption and area. The phase noise ($S_\Phi$) due to TDC quantization noise is defined can be expression as:

$$S_\Phi(f)|_{tdc} = \frac{1}{T}|2\pi NG(f)|^2 \frac{\Delta t^2}{12}$$

where $\Delta t$ is the TDC resolution and $G(f)$ is the loop transfer function which is low pass in nature.

In one embodiment, the direction of propagation of a signal through first delay line 401 is opposite to the direction of propagation of a signal through second delay line 402. In one embodiment, first and second delay lines (401 and 402) have equal number of delay stages. In one embodiment, each delay stage of the first and second delay lines (401 and 402) have equal propagation delays. For example, propagation delay of delay stage r0 is the same as propagation delay of delay stage r1, f15, f0, etc.

Continuing with the PLL example, in one embodiment, Ref Clock is input to first delay line 401 while Fb Clock is input to second delay line 402. In one embodiment, each delay stage in first delay line 401 generates a phase of Ref Clock. For example, output of delay stage r0 is R_ph1, output of delay stage r1 is R_ph2, and so on. In one embodiment, each delay stage in second delay line 402 generates a phase of Fb Clock. For example, output of delay stage f0 is F_ph1, output of delay stage f1 is F_ph2, and so on.

In one embodiment, Ref Clock (i.e., phase zero of Ref Clock) is compared with F_ph15 (i.e., phase fifteen of Fb Clock) by comparator cp0. In one embodiment, R_ph1 (i.e., phase one of Ref Clock) is compared with F_ph15 (i.e., phase fifteen of Fb Clock) by comparator cp1. In one embodiment, R_ph1 (i.e., phase two of Ref Clock) is compared with F_ph14 (i.e., phase fourteen of Fb Clock) by comparator cp2. Continuing with the example, in one embodiment, R_ph13 (i.e., phase thirteen of Ref Clock) is compared with F_ph2 (i.e., phase two of Fb Clock) by comparator cp28. In one embodiment, R_ph14 (i.e., phase fourteen of Ref Clock) is compared with F_ph2 (i.e., phase two of Fb Clock) by comparator cp29. In one embodiment, R_ph14 (i.e., phase fourteen of Ref Clock) is compared with F_ph1 (i.e., phase one of Fb Clock) by comparator cp30. In one embodiment, R_ph15 (i.e., phase fifteen of Ref Clock) is compared with F_ph1 (i.e., phase one of Fb Clock) by comparator cp31.

In this example, TDC 400 compares 16 phases of Ref Clock to 16 phases of Fb Clock. The comparison between the $8^{th}$ Ref Clock phase (i.e., R_ph8) and the $8^{th}$ Fb Clock phase (i.e., F_ph8) determines which clock leads and which lags, giving the sign of the TDC output. Comparing the $8^{th}$ Ref Clock phase (i.e., R_ph8) to the $9^{th}$ Fb Clock phase (i.e., F_ph9) establishes if the Fb Clock leads by more than 1 bit (e.g., 20 ps). Comparing the $7^{th}$ Ref Clock phase (i.e., R_ph7) to the $9^{th}$ Fb Clock phase (i.e., F_ph9) establishes if the Fb Clock leads by more than 2 bits (e.g., 40 ps), and so on. TDC 400 topology provides a symmetric design for both positive and negative phase differences, balances loading on all phases, and is conducive to matching, according to one embodiment.

In one embodiment, output of each comparator is combined to form the bus Out[31:0] (i.e., outputs Out0, Out1, to Out31 are combined to form a bus). Here, Out[31:0] is a linear and symmetric output. In this embodiment, Ref Clock and Fb Clock are injected into first delay line 401 and second delay line 402 respectively which run (in terms of signal propagation direction) in opposite directions relative to one another. In one embodiment, each of the comparators of the plurality of comparators cp0 to cp31 are coupled such that phase difference between Ref Clock and Fb Clock in every two consecutive comparators increments by a delay of one delay stage. In one embodiment, each comparator detects a phase error, and the comparator in the center of TDC 400 i.e., comparator cp15, detects whether phase difference between Ref Clock and FB Clock is zero (or within a small (e.g., 5%) threshold of zero).

The embodiment of TDC 400 is linear because the delay difference between outputs of the comparators is the same. The embodiment of TDC 400 is symmetric around the center (i.e., comparator cp15) because Ref Clock and Fb Clock propagate through exactly the same number of delay stages (with same propagation delays) when they are compared by comparator cp15.

Figure 4B:
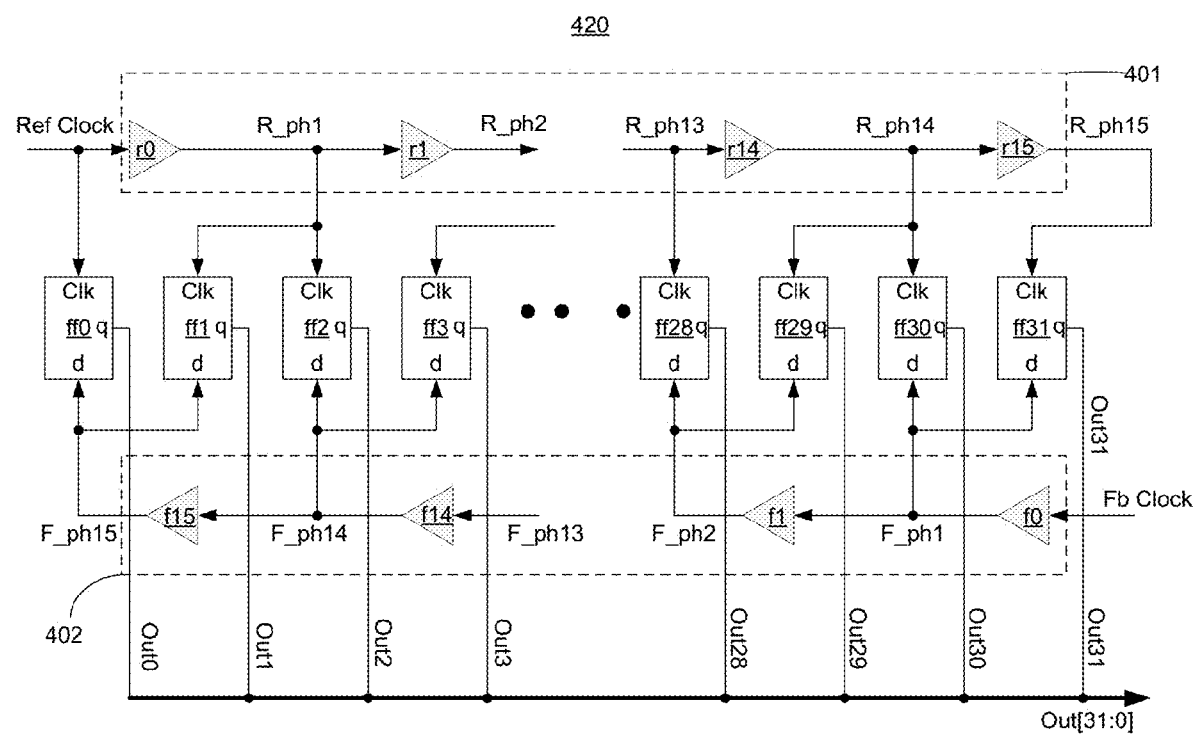
FIG. 4B illustrates a symmetric and linear TDC with flip-flops as comparators, according to one embodiment of the disclosure.

FIG. 4B illustrates a symmetric and linear TDC 420 with flip-flops as comparators, according to one embodiment of the disclosure. It is pointed out that those elements of FIG. 4B having the same reference numbers (or names) as the elements of any other figure can operate or function in any manner similar to that described, but are not limited to such.

So as not to obscure the embodiment of FIG. 4B, differences between FIG. 4B and FIG. 4A are described. In one embodiment, comparators cp0-cp31 of FIG. 4A are implemented as flip-flops ff0-ff31. In one embodiment, Ref Clock and its phases are received by the clock (Clk) input terminal of the flip-flops while Fb Clock and its phases are received by the data (d) input terminal of the flip-flops. In one embodiment, Ref Clock and its phases are received by the 'd' input terminals of the flip-flops while Fb Clock and its phases are received by Clk input terminal of the flip-flops. In all other aspects, TDC 420 operates like TDC 400.

Figure 4C:
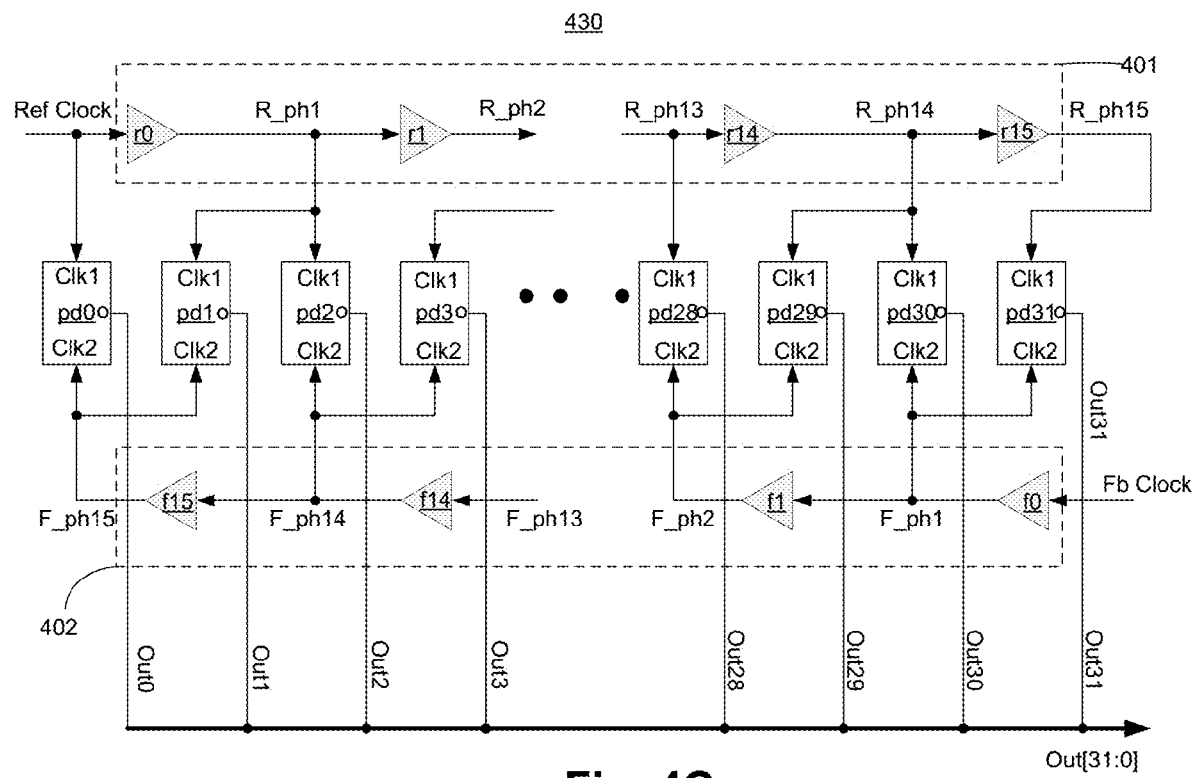
FIG. 4C illustrates a symmetric and linear TDC with phase detectors as comparators, according to one embodiment of the disclosure.

FIG. 4C illustrates a symmetric and linear TDC 430 with phase detectors as comparators, according to one embodiment of the disclosure. It is pointed out that those elements of FIG. 4C having the same reference numbers (or names) as the elements of any other figure can operate or function in any manner similar to that described, but are not limited to such.

So as not to obscure the embodiment of FIG. 4C, differences between FIG. 4C and FIG. 4A are described. In one embodiment, comparators cp0-cp31 of FIG. 4A are implemented as bang-bang phase detectors pd1-pd31. In one embodiment, Ref Clock and its phases are received by the Clk1 input terminals of the bang-bang phase detectors while Fb Clock and its phases are received by Clk2 input terminals of the bang-bang phase detectors. A bang-bang phase detector compares phases of two inputs and generates a single bit output indicating lead/lag relationship between the two inputs. In all other aspects, TDC 430 operates like TDC 400.

Figures 5, 6:
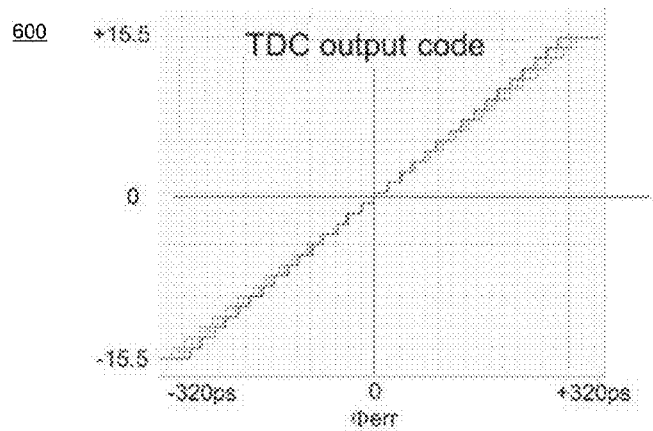
FIG. 5 illustrates a table showing operation of symmetric and linear TDC, according to one embodiment of the disclosure.
FIG. 6 illustrates a plot showing a transfer function for the symmetric and linear TDC, according to one embodiment of the disclosure.

FIG. 5 illustrates a table 500 showing operation of symmetric and linear TDC, according to one embodiment of the disclosure. It is pointed out that those elements of FIG. 5 having the same reference numbers (or names) as the elements of any other figure can operate or function in any manner similar to that described, but are not limited to such.

The top row in table 500 is the comparator number (Comp #) ranging from 0 to 30 (comparator 31 is not shown). The second row from the top is Ref Clock phase at different comparators (i.e., Refclk phase at Comp). The third row from the top is Fb Clock phase at different comparators (i.e., Fbclk phase at Comp). The fourth row from the top is the phase difference between Ref Clock and Fb Clock for different comparators (i.e., Fbclk-Refclk at comp). The shaded column of table 500 shows that comparator fifteen is the center comparator i.e., cp15. Center comparator cp15 receives phase eight of both Ref Clock and Fb Clock (i.e., R_ph15 and F_ph15) thus making TDC 400 fully symmetric.

FIG. 6 illustrates a plot 600 showing transfer function for the symmetric and linear TDC, according to one embodiment of the disclosure. It is pointed out that those elements of FIG. 6 having the same reference numbers (or names) as the elements of any other figure can operate or function in any manner similar to that described, but are not limited to such.

Here, x-axis is phase error and y-axis is TDC output code. In this example phase error (Φerr) ranges from −320 ps to +320 ps while TDC output code ranges from −15.5 to +15.5. Plot 600 shows TDC 400 is symmetric around zero phase error. Code transition at the center happens when phase error is zero. Plot 600 shows TDC 400 is linear because each step size (identified by delay of delay stages) near and away from the center is identical to the rest of the steps.

Figure 7:
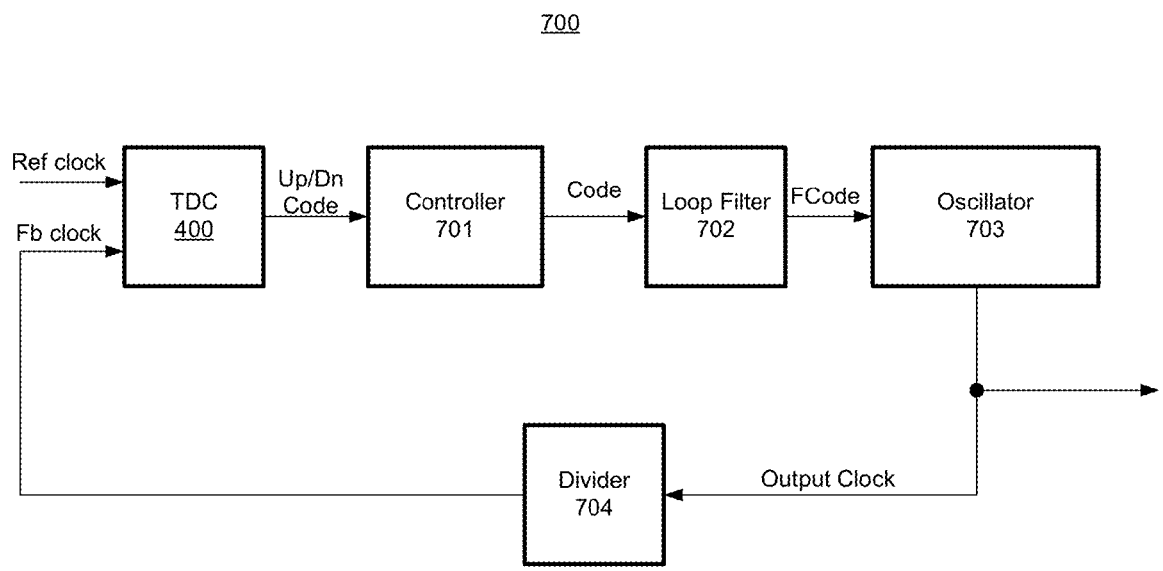
FIG. 7 illustrates a phase locked loop (PLL) with the symmetric and linear TDC, according to one embodiment of the disclosure.

FIG. 7 illustrates a PLL 700 with the symmetric and linear TDC, according to one embodiment of the disclosure. It is pointed out that those elements of FIG. 7 having the same reference numbers (or names) as the elements of any other figure can operate or function in any manner similar to that described, but are not limited to such.

In one embodiment, PLL 700 comprises TDC 400 (420 or 430), Controller 701, Loop Filter 702, Oscillator 703, and Divider 704. In one embodiment, PLL 700 is a digital PLL. While the embodiment is explained with reference to PLL

700, it can also be used for a delay locked loop (DLL) or other circuits. In one embodiment, TDC 400 receives Ref Clock (e.g., generated by another PLL or a crystal oscillator) and Fb Clock. In one embodiment, TDC 400 generates an output bus (i.e., Up/Dn Code) indicating the phase difference between Ref Clock and Fb Clock. In one embodiment, Controller 701 receives the output from TDC 400 to generate Code which indicates whether Oscillator 703 should increase, decrease, or keep constant its oscillating frequency. In one embodiment, output of Controller 701 is filtered by Loop Filter 702.

In one embodiment, Loop Filter 702 is a digital loop filter that filters the Code to generate FCode. In one embodiment, FCode is received by Oscillator 703 to control its oscillating frequency. In one embodiment, output of Oscillator is Output Clock. In one embodiment, Output Clock is received by Divider 704 which generates Fb Clock. In one Oscillator 703 is a digitally controlled oscillator (DCO). In another embodiment, Oscillator 703 is an LC tank based oscillator. The symmetric and linear TDC 400 reduces overall jitter at the Output Clock of PLL 700. While the embodiments are described with reference to a PLL, TDC of the embodiments can be used in any circuit where time to digital conversion is desired.

Figure 8:
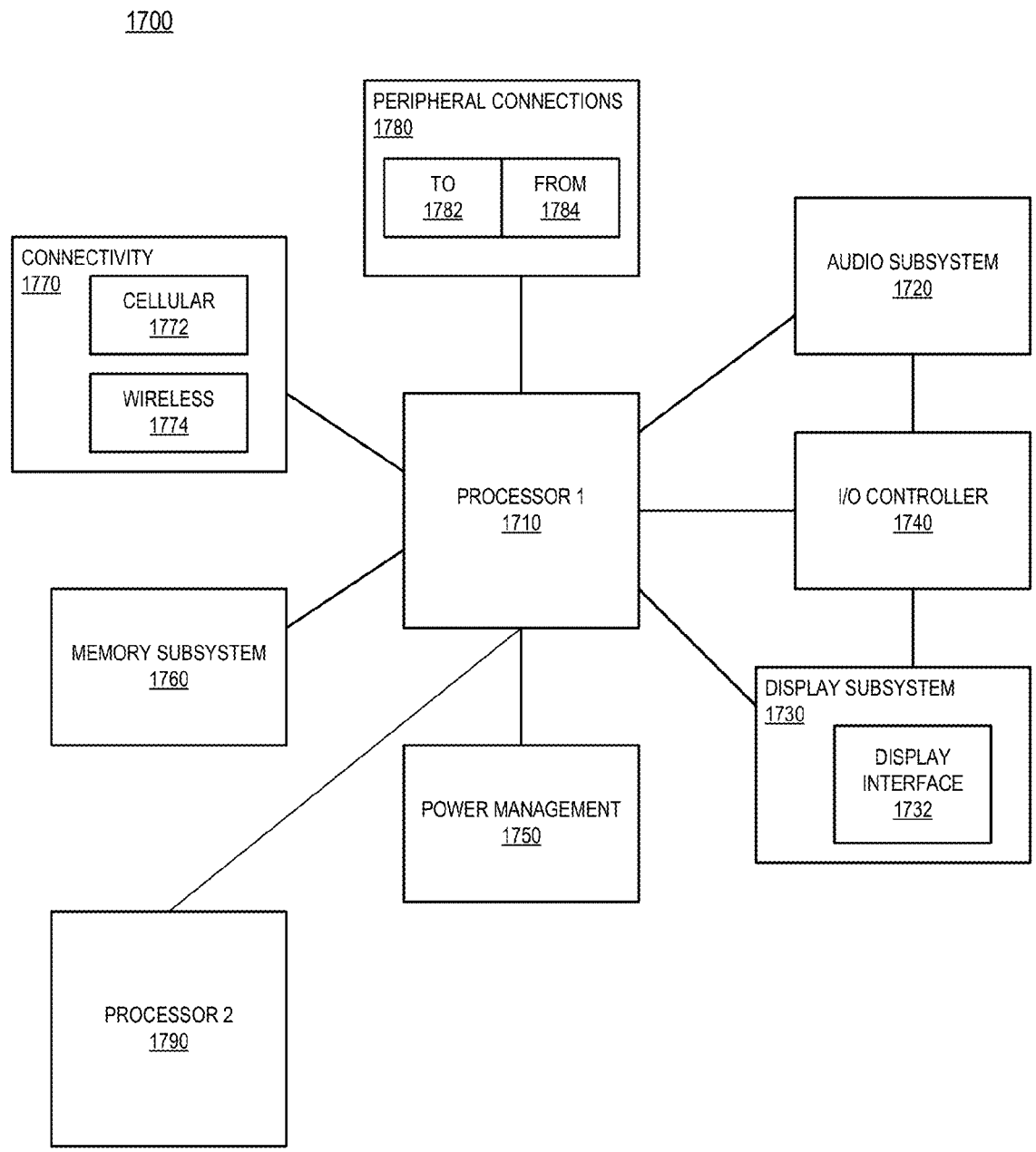
FIG. 8 is a smart device or a computer system or an SoC (System-on-Chip) with symmetric and linear TDC, according to one embodiment of the disclosure.

FIG. 8 is a smart device or a computer system or an SoC (System-on-Chip) with symmetric and linear TDC, according to one embodiment of the disclosure. It is pointed out that those elements of FIG. 8 having the same reference numbers (or names) as the elements of any other figure can operate or function in any manner similar to that described, but are not limited to such.

FIG. 8 illustrates a block diagram of an embodiment of a mobile device in which flat surface interface connectors could be used. In one embodiment, computing device 1700 represents a mobile computing device, such as a computing tablet, a mobile phone or smart-phone, a wireless-enabled e-reader, or other wireless mobile device. It will be understood that certain components are shown generally, and not all components of such a device are shown in computing device 1700.

In one embodiment, computing device 1700 includes a first processor 1710 with apparatus for reducing periodic clock jitter in a ring oscillator described with reference to embodiments discussed. Other blocks of the computing device 1700 may also include apparatus for reducing periodic clock jitter in a ring oscillator described with reference to embodiments discussed. The various embodiments of the present disclosure may also comprise a network interface within 1770 such as a wireless interface so that a system embodiment may be incorporated into a wireless device, for example, cell phone or personal digital assistant.

In one embodiment, processor 1710 (and processor 1790) can include one or more physical devices, such as microprocessors, application processors, microcontrollers, programmable logic devices, or other processing means. The processing operations performed by processor 1710 include the execution of an operating platform or operating system on which applications and/or device functions are executed. Processor 1790 may be optional. The processing operations include operations related to I/O (input/output) with a human user or with other devices, operations related to power management, and/or operations related to connecting the computing device 1700 to another device. The processing operations may also include operations related to audio I/O and/or display I/O.

In one embodiment, computing device 1700 includes audio subsystem 1720, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1700, or connected to the computing device 1700. In one embodiment, a user interacts with the computing device 1700 by providing audio commands that are received and processed by processor 1710.

Display subsystem 1730 represents hardware (e.g., display devices) and software (e.g., drivers) components that provide a visual and/or tactile display for a user to interact with the computing device 1700. Display subsystem 1730 includes display interface 1732, which includes the particular screen or hardware device used to provide a display to a user. In one embodiment, display interface 1732 includes logic separate from processor 1710 to perform at least some processing related to the display. In one embodiment, display subsystem 1730 includes a touch screen (or touch pad) device that provides both output and input to a user.

I/O controller 1740 represents hardware devices and software components related to interaction with a user. I/O controller 1740 is operable to manage hardware that is part of audio subsystem 1720 and/or display subsystem 1730. Additionally, I/O controller 1740 illustrates a connection point for additional devices that connect to computing device 1700 through which a user might interact with the system. For example, devices that can be attached to the computing device 1700 might include microphone devices, speaker or stereo systems, video systems or other display devices, keyboard or keypad devices, or other I/O devices for use with specific applications such as card readers or other devices.

As mentioned above, I/O controller 1740 can interact with audio subsystem 1720 and/or display subsystem 1730. For example, input through a microphone or other audio device can provide input or commands for one or more applications or functions of the computing device 1700. Additionally, audio output can be provided instead of, or in addition to display output. In another example, if display subsystem 1730 includes a touch screen, the display device also acts as an input device, which can be at least partially managed by I/O controller 1740. There can also be additional buttons or switches on the computing device 1700 to provide I/O functions managed by I/O controller 1740.

In one embodiment, I/O controller 1740 manages devices such as accelerometers, cameras, light sensors or other environmental sensors, or other hardware that can be included in the computing device 1700. The input can be part of direct user interaction, as well as providing environmental input to the system to influence its operations (such as filtering for noise, adjusting displays for brightness detection, applying a flash for a camera, or other features).

In one embodiment, computing device 1700 includes power management 1750 that manages battery power usage, charging of the battery, and features related to power saving operation. Memory subsystem 1760 includes memory devices for storing information in computing device 1700. Memory can include nonvolatile (state does not change if power to the memory device is interrupted) and/or volatile (state is indeterminate if power to the memory device is interrupted) memory devices. Memory subsystem 1760 can store application data, user data, music, photos, documents, or other data, as well as system data (whether long-term or temporary) related to the execution of the applications and functions of the computing device 1700.

Elements of embodiments are also provided as a machine-readable medium (e.g., memory 1760) for storing the computer-executable instructions (e.g., instructions to implement any other processes discussed herein). The machine-readable medium (e.g., memory 1760) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1770 includes hardware devices (e.g., wireless and/or wired connectors and communication hardware) and software components (e.g., drivers, protocol stacks) to enable the computing device 1700 to communicate with external devices. The computing device 1700 could be separate devices, such as other computing devices, wireless access points or base stations, as well as peripherals such as headsets, printers, or other devices.

Connectivity 1770 can include multiple different types of connectivity. To generalize, the computing device 1700 is illustrated with cellular connectivity 1772 and wireless connectivity 1774. Cellular connectivity 1772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1774 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1780 include hardware interfaces and connectors, as well as software components (e.g., drivers, protocol stacks) to make peripheral connections. It will be understood that the computing device 1700 could both be a peripheral device ("to" 1782) to other computing devices, as well as have peripheral devices ("from" 1784) connected to it. The computing device 1700 commonly has a "docking" connector to connect to other computing devices for purposes such as managing (e.g., downloading and/or uploading, changing, synchronizing) content on computing device 1700. Additionally, a docking connector can allow computing device 1700 to connect to certain peripherals that allow the computing device 1700 to control content output, for example, to audiovisual or other systems.

In addition to a proprietary docking connector or other proprietary connection hardware, the computing device 1700 can make peripheral connections 1780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided with comprises: a first input; a second input; a first delay line having a plurality of delay stages coupled together in series, the first delay line to receive the first input; a second delay line having a plurality of delay stages coupled together in series, the second delay line to receive the second input; and a plurality of comparators, each having first and second inputs coupled to the first and second delay lines.

In one embodiment, the first and second delay lines have equal number of respective plurality of delay stages. In one embodiment, each of the delay stages of the first and second delay lines have substantially equal propagation delays. In one embodiment, a direction of signal propagation in the first delay line is opposite to a direction of signal propagation in the second delay line. In one embodiment, each comparator of the plurality of comparators is coupled to the first and second delay lines such that phase difference in every two consecutive comparators from the plurality of comparators is to increment by one delay stage in the first and second delay lines.

In one embodiment, the plurality of comparators has a middle comparator, the middle comparator having an output which indicates a phase error between the first and second inputs which is substantially zero when the first and second inputs have substantially equal phases. In one embodiment, the plurality of comparators comprises a plurality of flip-flops. In one embodiment, the plurality of comparators comprises a plurality of bang-bang phase detectors.

In another example, a PLL is provided which comprises: an oscillator to generate an output clock; a divider to receive the output clock and to generate a feedback clock; a time-to-digital converter (TDC) for comparing a reference clock with the feedback clock, the TDC including: a first input; a second input; a first delay line having a plurality of delay stages coupled together in series, the first delay line to receive the first input; a second delay line having a plurality of delay stages coupled together in series, the second delay line to receive the second input; and a plurality of comparators, each having first and second inputs coupled to the first and second delay lines; and a controller to receive output of the TDC and to generate a code indicating direction of change in frequency of the output clock.

In one embodiment, the oscillator is a digitally controlled oscillator. In one embodiment, the PLL further comprises a loop filter to receive the code and to generate a filtered code for use by the oscillator. In one embodiment, the first and second delay lines have equal number of respective plurality of delay stages. In one embodiment, each of the delay stages of the first and second delay lines have substantially equal propagation delays. In one embodiment, a direction of signal propagation in the first delay line is opposite to a direction of signal propagation in the second delay line. In one embodiment, each comparator of the plurality of comparators is coupled to the first and second delay lines such that phase difference in every two consecutive comparators from the plurality of comparators is to increment by one delay stage in the first and second delay lines.

In one embodiment, the plurality of comparators has a middle comparator, the middle comparator having an output which indicates a phase error between the first and second inputs which is substantially zero when the first and second inputs have substantially equal phases. In one embodiment, the plurality of comparators are at least one of: a plurality of flip-flops; or a plurality of bang-bang phase detectors.

In another example, a system is provided which comprises: a memory; and a processor coupled to the memory, the processor having a time-to-digital converter according to the apparatus described above. In one embodiment, the system further comprises a wireless interface for allowing the processor to communicate with another device. In one embodiment, the system further comprises a display unit. In one embodiment, the display is a touch screen.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a first input;
a second input;
a first delay line having a plurality of delay stages coupled together in series, the first delay line to receive the first input;
a second delay line having a plurality of delay stages coupled together in series, the second delay line to receive the second input; and
a plurality of comparators, each having first and second inputs coupled to the first and second delay lines,
wherein multiple delay stages of the first and second delay lines are coupled to provide equally delayed input signals for two comparators, and
wherein each of the comparators is coupled to a unique pair of the delay stages.

2. The apparatus of claim 1, wherein the first and second delay lines have equal number of respective plurality of delay stages.

3. The apparatus of claim 2, wherein each of the delay stages of the first and second delay lines have substantially equal propagation delays.

4. The apparatus of claim 1, wherein a sequence of the delay stages coupled to provide the input signals for the plurality of comparators in the first delay line is in the opposite direction to a sequence of the delay stages coupled to provide the input signals in the second delay line.

5. The apparatus of claim 1, wherein each comparator of the plurality of comparators is coupled to the first and second delay lines such that phase difference in every two consecutive comparators from the plurality of comparators is to increment by one delay stage in the first and second delay lines.

6. The apparatus of claim 1, wherein the plurality of comparators has a middle comparator, the middle comparator having an output which indicates a phase error between the first and second inputs which is substantially zero when the first and second inputs have substantially equal phases.

7. The apparatus of claim 1, wherein the plurality of comparators comprises a plurality of flip-flops.

8. The apparatus of claim 1, wherein the plurality of comparators comprises a plurality of bang-bang phase detectors.

9. A phase locked loop (PLL) comprising:
an oscillator to generate an output clock;
a divider to receive the output clock and to generate a feedback clock;
a time-to-digital converter (TDC) for comparing a reference clock with the feedback clock, the TDC including:
a first input;
a second input;
a first delay line having a plurality of delay stages coupled together in series, the first delay line to receive the first input;
a second delay line having a plurality of delay stages coupled together in series, the second delay line to receive the second input; and
a plurality of comparators, each having first and second inputs coupled to the first and second delay lines,
wherein multiple delay stages of the first and second delay lines are coupled to provide equally delayed input signals for two comparators, and
wherein each of the comparators is coupled to a unique pair of the delay stages; and
a controller to receive output of the TDC and to generate a code indicating direction of change in frequency of the output clock.

10. The PLL of claim 9, wherein the oscillator is a digitally controlled oscillator.

11. The PLL of claim 9 further comprises a loop filter to receive the code and to generate a filtered code for use by the oscillator.

12. The PLL of claim 9, wherein the first and second delay lines have equal number of respective plurality of delay stages.

13. The PLL of claim 12, wherein each of the delay stages of the first and second delay lines have substantially equal propagation delays.

14. The PLL of claim 9, wherein a sequence of the delay stages coupled to provide the input signals for the plurality of comparators in the first delay line is in the opposite direction to a sequence of the delay stages coupled to provide the input signals in the second delay line.

15. The PLL of claim 9, wherein each comparator of the plurality of comparators is coupled to the first and second delay lines such that phase difference in every two consecutive comparators from the plurality of comparators is to increment by one delay stage in the first and second delay lines.

16. The PLL of claim 9, wherein the plurality of comparators has a middle comparator, the middle comparator having an output which indicates a phase error between the first and second inputs which is substantially zero when the first and second inputs have substantially equal phases.

17. The PLL of claim 9, wherein the plurality of comparators are at least one of:
   a plurality of flip-flops; or
   a plurality of bang-bang phase detectors.

18. A system comprising:
   a memory;
   a processor coupled to the memory, the processor having a time-to-digital converter comprising:
      a first input;
      a second input;
      a first delay line having a plurality of delay stages coupled together in series, the first delay line to receive the first input;
      a second delay line having a plurality of delay stages coupled together in series, the second delay line to receive the second input; and
      a plurality of comparators, each having first and second inputs coupled to the first and second delay lines,
      wherein multiple delay stages of the first and second delay lines are coupled to provide equally delayed input signals for two comparators, and
      wherein each of the comparators is coupled to a unique pair of the delay stages; and
   a wireless interface for allowing the processor to communicate with another device.

19. The system of claim 18 further comprises a display unit.

20. The system of claim 18, wherein the first and second delay lines have equal number of respective plurality of delay stages, and wherein each of the delay stages of the first and second delay lines have substantially equal propagation delays.

* * * * *